United States Patent [19]

Mariani et al.

[11] Patent Number: 4,912,356
[45] Date of Patent: Mar. 27, 1990

[54] SAW SLANTED ARRAY CORRELATOR (SAC) WITH SEPARATE AMPLITUDE COMPENSATION CHANNEL

[75] Inventors: Elio A. Mariani, Hamilton Square; William J. Skudera, Jr., Oceanport, both of N.J.

[73] Assignee: The United States of America as represented by the Secretary of the Army, Washington, D.C.

[21] Appl. No.: 353,576

[22] Filed: May 18, 1989

[51] Int. Cl.$^4$ .............................................. H01L 41/08
[52] U.S. Cl. ............................ 310/313 C; 310/313 B; 310/313 D; 333/151; 333/195
[58] Field of Search ........... 310/313 B, 313 C, 313 D; 333/151, 153, 154, 194, 195

[56] References Cited

U.S. PATENT DOCUMENTS 4,633,117  12/1986  Bloch et al. .................... 310/313 B

OTHER PUBLICATIONS

"Surface Acoustic Wave Slanted Correlators for Linear FM Pulse-Compressors", by B. R. Potter and C. S. Hartmann, Texas Instruments Incorporated, 1977 Ultrasonics Symposium Proceedings, IEEE, Cat. #77CH1264-1SU, pp. 607-610.
"Phase Compensation of Linear FM Slanted Transducers by Use of Metallized Stripes", by J. B. Cooper and B. R. Potter, Texas Instruments Incorporated, 1982 Ultrasonics Symposium, pp. 96-66.

Primary Examiner—Mark O. Budd
Attorney, Agent, or Firm—Michael Zelenka; Ann M. Knab

[57] ABSTRACT

A SAW slanted array correlator (SAC) comprises a piezoelectric substrate, an input and an output interdigital transducer deposited on the piezoelectric substrate, and a reflective array aligned with the transducers. The input and output transducer are slanted at equal and opposite appropriate angles to each other. The reflective array is disposed on the substrate at an angle the same as the angle of emplacement of the output transducer. The transducers comprise a number of interdigital electrodes with varying periodicity, the periodicity being the same for corresponding portions of the two transducers. The reflective array comprises a number of shorted interdigital electrodes having a periodicity corresponding to the periodicity of the output transducer. The reflective array comprises portion of selected electrodes which are active, partially active or inactive.

8 Claims, 2 Drawing Sheets

SAW SLANTED ARRAY CORRELATOR (SAC) WITH SEPARATE AMPLITUDE COMPENSATION CHANNEL

The invention described herein may be manufactured, used and licensed by or for the Government without payment to us of any royalty thereon.

TECHNICAL FIELD

This invention relates generally to surface acoustic wave (SAW) dispersive delay-line slanted-array correlators (SAC), and more particularly to SAW-SAC devices with a separate channel for device amplitude error compensation.

BACKGROUND OF THE INVENTION

Surface acoustic wave slanted array correlator (SAW-SAC) devices are ideal choices for implementing wideband compressive receivers for electronic intelligence (ELINT) and electronic support measure (ESM) applications because the SAW-SAC wide bandwidth capability allows the instantaneous sampling of signals over a wide frequency range of several hundred megahertz. These devices can be designed to minimize both frequency domain fresnel ripples (which affect time-domain sidelobes) and the effect of interelectrode reflections The receiver system's signal sorting performance degrades relative to the design ideal as the amplitude and phase errors in the SAW-SAC device degrade. The residual phase and amplitude errors resulting from fabrication tolerances and design inaccuracies cause the degradation in the time sidelobe performance of the compressed pulse.

Phase compensation in SAW-SAC devices may be achieved by placing a metallized strip between the input and output transducers. This concept is described in "Phase Compensation of Linear FM Slanted Transducers By Use Of Metallized Stripes" by T. B. Cooper et al. This method has provided a phase error peak reduction of up to 90% resulting in a corresponding reduction in the compressed pulse time-sidelobes. With lower sidelobe levels, better close-in instantaneous dynamic range can be achieved in receivers. Although effective methods have been developed for phase compensation for SAW-SAC devices, further reduction of time sidelobes would occur if amplitude errors were minimized independently from phase errors.

SUMMARY OF THE INVENTION

The primary object of the invention is to improve the SAW-SAC device time-sidelobe performance.

It is an object of the invention to provide a SAW-SAC device having separate phase and amplitude correction channels.

It is a still further oject of the invention to minimize the amplitude errors associated with SAWSAC devices in order to achieve better time-sidelobe performance.

The above and other objects are achieved in accordance with the invention wherein an input and an output transducer are aligned on a piezoelectric substrate, and slanted at equal and opposite angles to each other. Each transducer comprises a plurality of interdigital electrodes, the periodicity of which varies in a predetermined manner along the length of the transducer, the periodicity being the same for corresponding portions of each transducer. A reflective array is aligned parallel with the output interdigital transducers and positioned on the substrate at a distance equal to $N\lambda/2$ (where N is an integer and $\lambda$ is the acoustic wavelength) from the output transducer on the side adjacent to the output transducer (as shown in FIG. 1). The reflective array comprises a plurality of "shorted" interdigital electrodes with a periodicity corresponding to the periodicity of the output transducer. Selected portions of the "shorted" electrodes are partially "inactivated" or totally eliminated.

In operation, a signal will be propagated in the SAW-SAC device from the input transducer to the output transducer where the signal is partially transferred to the electrical load (i.e. output), partially reflected back to the input, and partially transmitted through the output transducer. The portion of the signal transmitted through the output transducer will be reflected back to the output transducer by the reflective array by selected "shorted" electrodes, which are considered "activated," while the signal continues through the reflective array where the selected electrodes are "inactivated" or removed.

BRIEF DESCRIPTION OF THE DRAWINGS

The invention will be more fully appreciated from the following detailed description when the same is considered in connection with the accompanying drawings in which.

DETAILED DESCRIPTION

Figure 1:
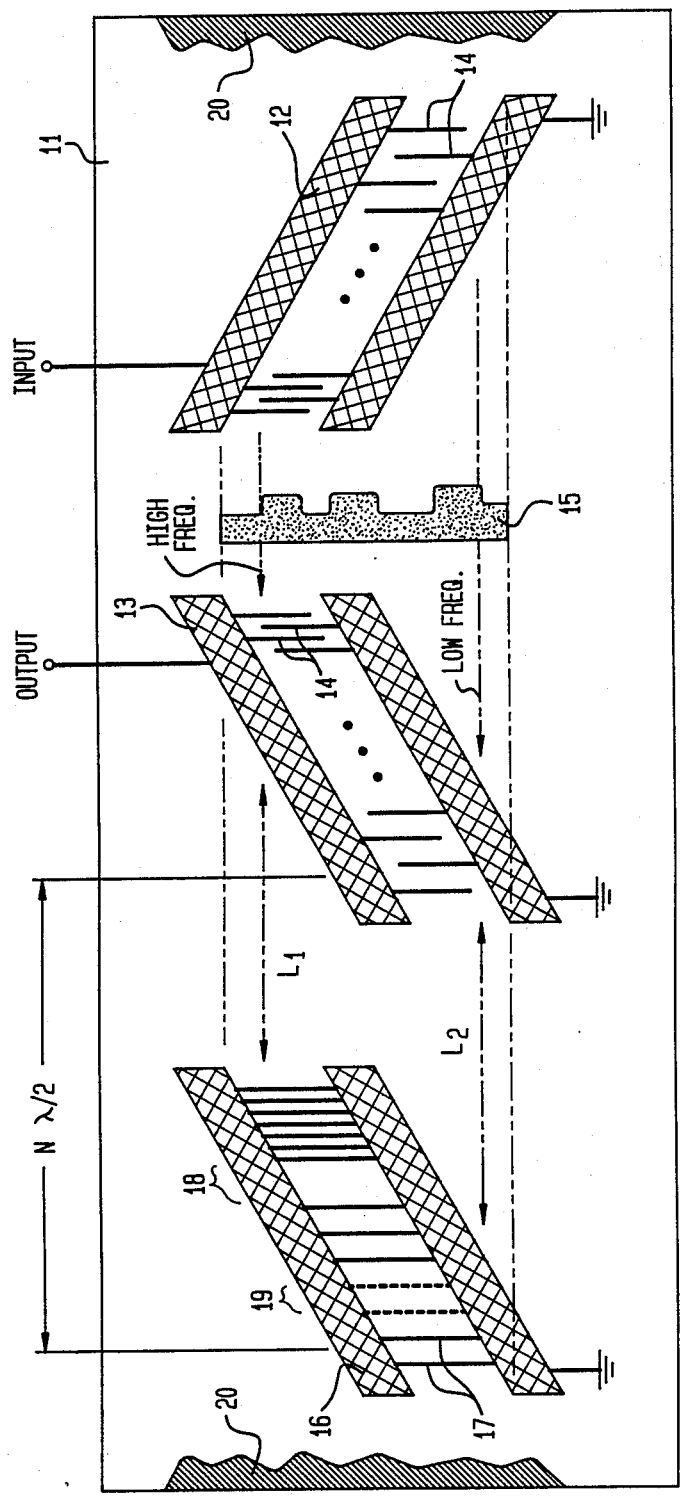
FIG. 1 illustrates a SAW-SAC device in accordance with the present invention.

Turning now to FIG. 1 of the drawings, there is shown a SAW-SAC device comprising a piezoelectric substrate 11 and a pair of conventional, dispersive interdigital transducers 12 and 13 for signal input/ output purposes. In a preferred embodiment, a SAW-SAC substrate of lithium niiobate is desireable. The invention, however, should in no way be construed as limited to this substrate and other known piezoelectric substrate materials (e.g. quartz) may be utilized in praticing the principles of the present invention. The input and output transducers, as well as the reflective grating to be described, are photo-etched in thin-film metal (i.e., aluminum) to produce a rugged monolithic device. The photolithographic process is itself a well-known method of fabrication. The input transducer 12 and output transducer 13 are aligned with each other on the substrate 11 and are slanted at equal and opposite appropriate angles to each other. The angle of emplacement is well known in the art, although the transducers are figuratively shown at approximately ±45°. Each transducer, 12 and 13, comprises a plurality of interdigital electrodes 14, the periodicity varying in a predetermined manner along the length of each transducer, the periodicity being the same in corresponding parts of each transducer. The periodicity variation of the electrodes 14, will be a linear function of frequency.

As displayed in FIG. 1, the SAW-SAC device produces a down chirped waveform, the slope of which is determined by the relative delay of the various frequencies. When the above-mentioned down-chirp signal is fed into a conjugate up-chirp device, a compressed pulse will appear at the output.

A thin-film phase correction strip 15, may be disposed halfway between the input transducer and the output transducer to compensate for phase errors. By properly choosing the profile of the metal film, the phase of all the frequency components can be shifted relative to each other and phase-error compensation effected.

Located adjacent to the output transducer on the side thereof opposite that of the input transducer is a reflective array 16. The reflective array, disposed on the substrate at an angle equal to that of the output transducer, comprises a plurality of "shorted" interdigital electrodes 17, the periodicity of which corresponds to that of the output transducer. For illustrative purposes, a region of electrodes 18, is completely removed to fully "inactivate" the electrodes, while another region of electrodes 19 is open-circuited to partially "inactivate" the electrodes. The process of removing or open-circuiting electrodes could involve lithographic or laser trimming techniques. The number and position of the "inactivated" and "activated" electrodes are not limited to this specific design, but may vary depending on the desired compensation. The reflective array is at a distance equal to $N\lambda/2$ from the output transducer, where N is an integer such as 1,2,3... and $\lambda$ is wavelength. An acoustic absorber 20 may be disposed near the end of substrate 11 adjacent to the input transducer 12 to absorb waves emanating in the direction away from the output transducer. Thus reflection of the waves back to the input transducer is prevented, subsequently preventing further errors in the output signal. An absorbing material 20 also would be placed behind the reflecting array.

During actual operation, a signal delivered to the input transducer 12 will cause a dispersive-type signal to be propagated in the SAW-SAC device toward the phase correction strip 15, if present, and will continue to the output transducer. At this point, the acoustic signal is partially coupled to an electrical load, partially reflected back to the input, and partially transmitted through the output transducer to an absorber. In conventional prior art SAW-SAC devices, that portion of the acoustic signal that travels through the output transducer is wasted and usually absorbed. Within the scope of the present invention, this "leakage" signal (e.g. $L_1$ or $L_2$) is used to selectively compensate the device amplitude ripple response by reflecting certain portions of the acoustic signal corresponding to frequencies where the amplitude reponse "dips." The "leakage" signal continues to the reflective array 16 where it is reflected back to the output transducer 13. The reflected signal from the reflective array is in-phase with the output signal due to the separation distance from the output transducer of $N\lambda/2$, thus it will add coherently at the output transducer. The "leakage" signal will only be reflected by the reflective array where there are electrodes or portions of electrodes present for signal amplitude control. The sections of the reflective array having no electrodes or having missing pieces of electrodes will provide no reflection or partial reflection respectively, and consequently that portion of the "leakage" signal will continue through and be absorbed. Actual determination of the desired reflective characteristics is performed by measuring the initial amplitude response, analyzing the "lows" or "dips" in the response and compensating for it at the respective frequencies. The reflective array comprises a set of "shorted" or "active" electrodes at the selected frequencies where compensation is required, and "inactive" where missing electrodes occur and compensation is not necessary, plus partially removed reflectors where a smaller amount of compensation is needed.

Figure 2:
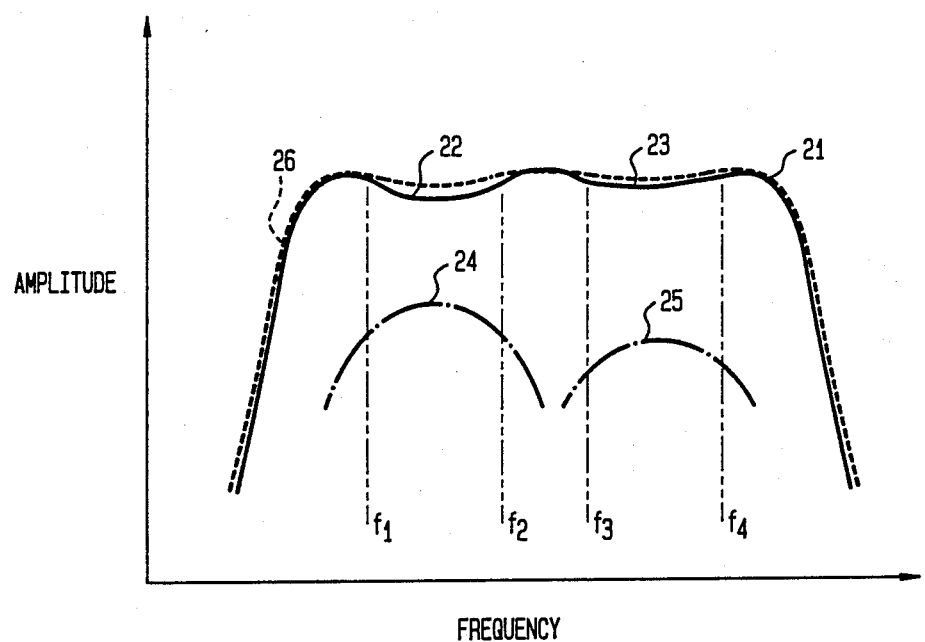
FIG. 2 shows a SAW-SAC device amplitude vs. frequency response with and without compensation.

FIG. 2 displays a frequency vs. amplitude response. The solid curve 21 represents the amplitude response without compensation, (e.g. the SAW-SAC device has no operating reflective array to compensate for amplitude errors). The "dips" 22 and 23 of the solid curve 21 correspond to amplitude errors. In order to compensate amplitude at the respective "dips," of the response,a reflective array is designed (through computation) to reflect the desired amount of the signal back in the designated frequency regions (e.g. $f_2-f_2$, $f_3-f_4$). The frequency responses 24 and 25 would coherently add to the uncompensated response 21 to achieve an improved amplitude response, dotted curve 26. Although the reflective array will have the same periodicity as the output transducer, the partial or full elimination of shorted electrodes in the array will be a function of the amplitude error compensation design. As the amplitude errors become minimal, time-sidelobe performance of the device is improved.

Accordingly, while a particular embodiment of the invention has been described in detail herein, it is to be understood that numerous other embodiments may be devised by those skilled in the art without departing from the spirit and scope of the invention.

What is claimed is:

1. A surface acoustic wave device comprising:
    a piezoelectric substrate for propagating surface acoustic waves;
    an input and an output interdigital transducer aligned with each other on said substrate;
    said input and output transducers being slanted at predetermined equal and opposite angles to each other;
    each transducer having a plurality of interdigital electrodes, the periodicity of which varies in a predetermined manner along the length of each transducer, the periodicity variation being the same for corresponding portions of the two transducers;
    and a reflective array aligned with said interdigital transducers and positioned on said substrate a distance from said output transducer on the side thereof opposite that of said input transducer;
    said reflective array having a plurality of shorted interdigital electrodes the periodicity of which corresponds to that of the output transducer;
    said reflective array being disposed on said substrate at an angle the same as that of said output transducer, selected electrodes of said reflective array being at least partially inactivated, the distance between the electrodes of said reflective array and the electrodes of said output transducer being equal to $N\lambda/2$, where N is an integer and $\lambda$ is acoustic wavelength corresponding to the frequency of operation 2. The surface acoustic wave device as defined in claim 1 wherein a portion of said selected electrodes of said reflective array are partially or fully inactivated and a portion of said selected electrodes of said reflective array are fully activated.

3. The surface acoustic wave device as defined in claim 2 wherein some of said selected electrodes of said reflective array are fully inactivated by fully removing said electrodes.

4. The surface accoustic wave device as defined in claim 3 wherein said selected electrodes of said reflective array are partially inactivated by open-circuiting some of said selected electrodes.

5. The surface acoustic wave device as defined in claim 4 further comprising a thin-film phase correction strip disposed halfway between said input and output transducer.

6. The surface acoustic wave device as defined in claim 5 further comprising a means for absorbing acoustic waves disposed on said substrate edges.

7. The surface acoustic wave device as defined in claim 6 wherein N may be equal to 1,2,3 . . .

8. The surface acoustic wave device as defined in claim 7 wherein said transducers and said reflective array are photo-etched in thin film metal on said substrate.

* * * * *